United States Patent
Lakin et al.

(10) Patent No.: US 6,686,128 B1
(45) Date of Patent: Feb. 3, 2004

(54) METHOD OF FABRICATING PATTERNED LAYERS OF MATERIAL UPON A SUBSTRATE

(75) Inventors: Kenneth Meade Lakin, Redmond, OR (US); Ralph Edward Rose, Bend, OR (US)

(73) Assignee: TFR Technologies, Inc., Bend, OR (US)

( * ) Notice: Subject to any disclaimer, the term of this patent is extended or adjusted under 35 U.S.C. 154(b) by 229 days.

(21) Appl. No.: 09/932,146

(22) Filed: Aug. 17, 2001

(51) Int. Cl.[7] .................................. G03C 5/56
(52) U.S. Cl. .................. 430/313; 430/315; 430/317; 430/318; 430/322; 430/311; 216/40
(58) Field of Search .............................. 430/313, 315, 430/317, 318, 322, 311; 216/40

(56) References Cited

U.S. PATENT DOCUMENTS 5,212,147 A * 5/1993 Sheats ..................... 505/413
5,554,488 A * 9/1996 Rioux ...................... 430/315

\* cited by examiner

*Primary Examiner*—Mark F. Huff
*Assistant Examiner*—Daborah Chacko-Davis
(74) *Attorney, Agent, or Firm*—Ronald M. Goldman; G. Joseph Buck

(57) ABSTRACT

A method for fabricating patterned layers of a desired material in a desired, design pattern upon a substrate, which method may be used in circumstances where the removal of photo-resist material may not be used to lift-off undesired portions of the material from the substrate. The method uses copper or some other conducting material instead of the photo-resist material, Which copper or other conducting material may be removed by chemical processes to lift-off the undesired portions of material deposited upon the conducting material and substrate. The copper or other conducting material is fabricated upon the substrate so as to have a lip that overhangs and shadows the boundary of photo-resist material previously fabricated upon the substrate in the desired pattern. The photo-resist material is removed from the substrate and the desired material is deposited upon the substrate in a substantially directed manner such that the lip of conducting material prevents the deposition of a substantial amount of the desired material upon the edge of the copper or other conducting material. As a consequence, chemical means can then be used to remove the conducting material, thus undercutting and lifting-off that portion of the desired material deposited upon the substrate which is not included within the design pattern.

6 Claims, 10 Drawing Sheets

METHOD OF FABRICATING PATTERNED LAYERS OF MATERIAL UPON A SUBSTRATE

CROSS-REFERENCES TO RELATED APPLICATIONS

Not Applicable

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of a contract awarded by an agency of the U.S. Government.

REFERENCE TO A "MICROFICHE APPENDIX"

Not Applicable

BACKGROUND OF THE INVENTION

1. Field of the Invention

The invention pertains to a method for the fabrication of microelectronic devices on substrates. More particularly this invention pertains to a method for the fabrication of layers of material in a specified, desired pattern upon a substrate, which patterned layers comprise the microelectronic devices or portions thereof. The method may be used for the fabrication of microwave acoustic resonators as well as other microelectronic devices.

For the purposes of this specification and the claims the terms "desired material" and "design pattern" mean the desired, design pattern in which a desired material is to be fabricated upon a substrate. The term "inverse pattern" means the negative, or complement of the design pattern. The meaning of the term "layer of material", in the appropriate context, also includes a layer of material from which some portions have been removed, e.g. where the portion of the layer included within the inverse pattern has been removed leaving the portion of the layer constituting the design pattern. The term "photo-resist material" also includes photo-imageable material. Although some of the following examples describe fabrication techniques that use positive photo-resist materials, it should be understood negative photo-resist materials could instead be used for these purpose and that the masks used for controlling the exposure of the photo-resist to ultraviolet light would then be inverted accordingly.

2. Description of the Prior Art

Methods for the fabrication of layers of desired material in design patterns upon a substrate are well known in the art. For example, a uniform layer of a desired material such as aluminum may be deposited upon a substrate by evaporation or other means and then covered by a layer of positive photo-resist material. The layer of positive photo-resist material is then exposed in the inverse pattern to ultraviolet light using a photographic mask. The exposed portions of the photo-resist material are then removed by application of appropriate chemicals in a developing process. Instead of ultraviolet light, other means such as electron beams could instead be used to render the portion of the photo-resist material so exposed susceptible to removal in the developing process. Chemical etchants, to which the remaining portions of the layer of photo-resist material are resistant, are then used to remove those portions of the layer of aluminum that are not protected by the remaining pattern of photo-resist material. Finally other chemical processes are used to remove the remaining photo-resist material, leaving upon the substrate a layer of aluminum, i.e. the desired material, having the desired, design pattern.

However, the fabrication process described above cannot be used in applications where the removal of the inverse pattern of the layer of aluminum, or other desired material, by etching or by other means would also remove other layers of the aluminum or other desired material previously deposited upon the substrate in those circumstances where one does not wish also to remove such other layers.

In such circumstances a second method in the prior art for fabricating layers of a desired material in a desired pattern on a substrate, commonly known as the "lift-off" method, can be used. The lift-off method reverses the sequence in which the layers are applied to, and removed from, the substrate. As illustrated in FIG. 1a, in the lift-off method, a layer of positive photo-resist material 101 is first deposited upon substrate 100 and an upper layer 102 of the photo-resist material is hardened so as to make the unexposed portions of layer 102 more resistant to removal in the developing process as compared to the unexposed portions of layer 101. Such hardening can be achieved by chemical treatment of the upper layer 102 of the material or by depositing layer 102 in a separate step using a more resistant photo-resist material. Next the layers of photo-resist material are exposed to ultraviolet in the design pattern and the exposed portion 106, depicted as the shaded area in FIG. 1b, is removed by chemicals in a developing process. Because layer 102 is more resistant to removal, the chemical developing process that removed portion 106 also slightly undercuts the edge of the unexposed portion of layer 102 leaving the overhanging lip 103 depicted in FIG. 1c, which lip extends slightly beyond the edge 107 of underlying layer 101.

As indicated in FIG. 1d, a layer 104 and 105 of the desired material is next deposited over the substrate by evaporation or other means that transports the desired material in a directional manner as indicated by arrows 108 such that that none of the desired material is deposited on edge 107 of layer 101 of photo-resist material that is shadowed by lip 103. A chemical etchant that does not attack the desired material, but that does attack the photo-resist material 101 is then applied to complete the removal of layer 101 causing layer 105 to be lifted-off from the substrate leaving the desired material in layer 104 in the design pattern on the substrate as depicted in FIG. 1e.

The essential element of the "lift-off" process is the creation of an overhanging lip that shadows the underlying edge 107 of the unexposed photo-resist material from the deposition of the desired material so that a chemical that does not attack the desired material can then be used to remove the photo-resist material, thereby undercutting and lifting off layer 105 of the desired material, leaving layer 104 of the desired material in the design pattern on the substrate.

Unfortunately, for some desired materials, the high temperatures and the extended length of application times that are used in the deposition process polymerizes the photo-resist material such that the photo-resist material can no longer be removed by normal chemical processes so as to lift-off the overlying layers of material. The prior art lift-off method also may not be used if the deposition flux for the desired material is not well columnated. In such a circumstance, the narrow lip on the layer of photo-resist material may be insufficient to shadow the edge of the underlying photo-resist material and the underlying edge would be coated with the desired material. This coating would then prevent the removal by etching of the underlying layer of photo-resist material.

BRIEF SUMMARY OF THE INVENTION

Instead of the photo-resist material used in the lift-off process described above, the method of the present invention uses a different material that is not polymerized or otherwise degraded by the high temperatures and extended periods used for the deposition of the desired materials. The different material can then still be removed by a chemical etchant so as to undercut and lift-off the overlying inverse pattern of material. The present invention thus provides a means for fabricating a desired material upon a substrate in a desired design pattern in circumstances where the high temperatures and/or extended deposition periods used to deposit the desired material upon the substrate would either substantially degrade or render unusable the prior methods of using photo-resist materials to fabricate the desired design patterns upon the substrate.

The present invention also provides a simple means for increasing the thickness of the layer of material that is removed by the chemical etchant so that the process may be used in circumstances where the combined thicknesses of multiple layers of desired materials deposited upon the substrate might otherwise equal or exceed the height of the overhanging lip used in the prior art lift-off process and, as a consequence, would prevent the underlying layer of material from being removed by the chemical etchant.

One embodiment of the present invention also provides a lip having a greater overhang that can be used to shadow a portion of the edge of the underlying material from the deposition of the desired material even when the deposition process is not fully directional. For instance, if the desired material is deposited using a process having other than very low partial pressures, molecular collisions will cause some material being deposited to follow different paths resulting in incomplete shadowing of the edge 107 from the desired material being deposited. By increasing the extent of the overhang, this embodiment of the invention can be used with such deposition processes.

DETAILED DESCRIPTION OF THE INVENTION

Figure 1A:
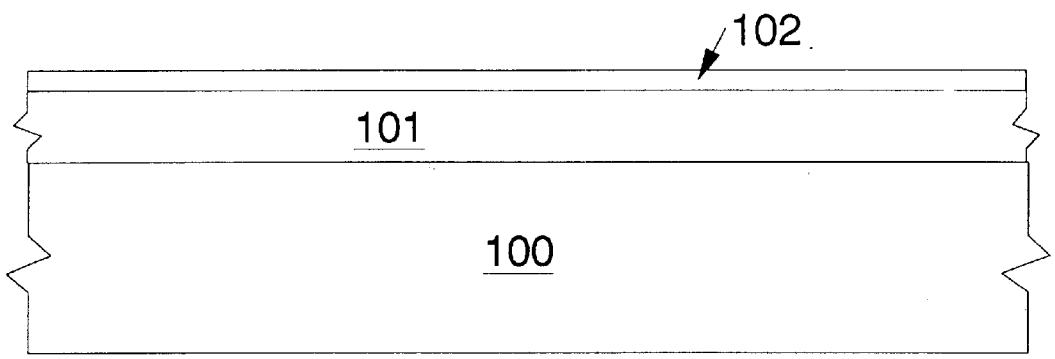
FIGS. 1a–1e depict a prior art method of fabricating desired design patterns on a substrate.
Figure 1B:
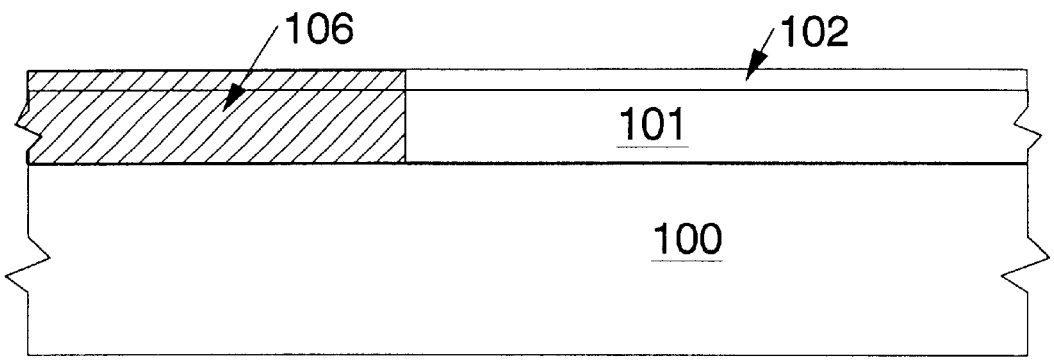
Figure 1C:
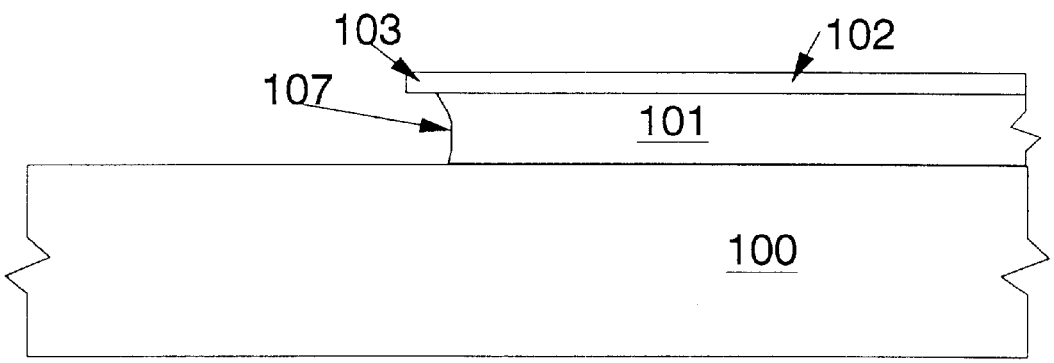
Figure 1D:
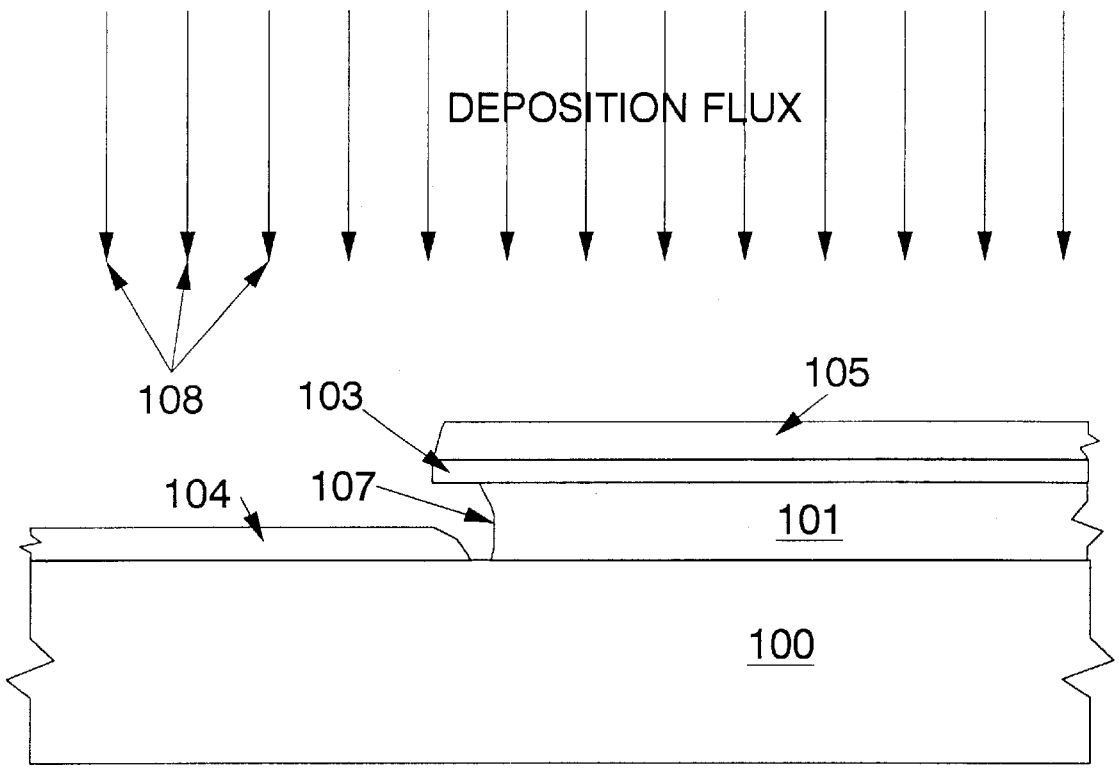
Figure 1E:
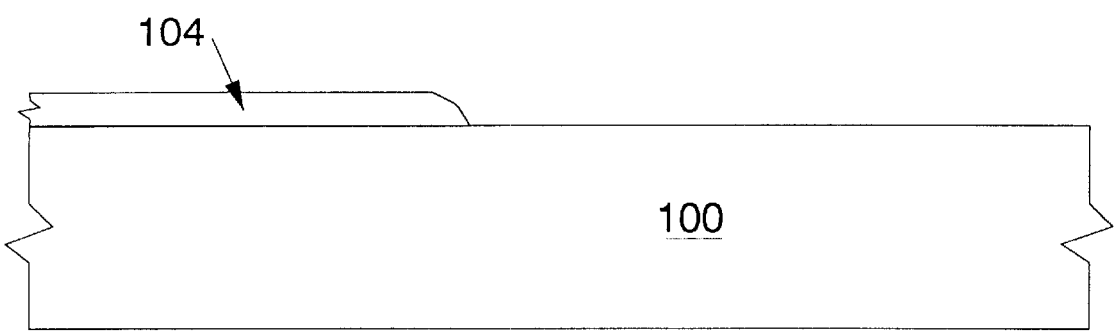
Figure 2A:
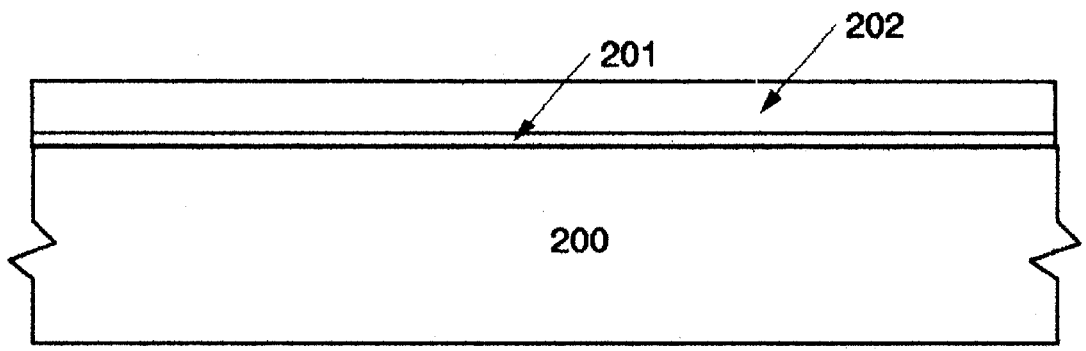
FIGS. 2a–2g depict steps in one embodiment of the method of this invention.
Figure 2B:
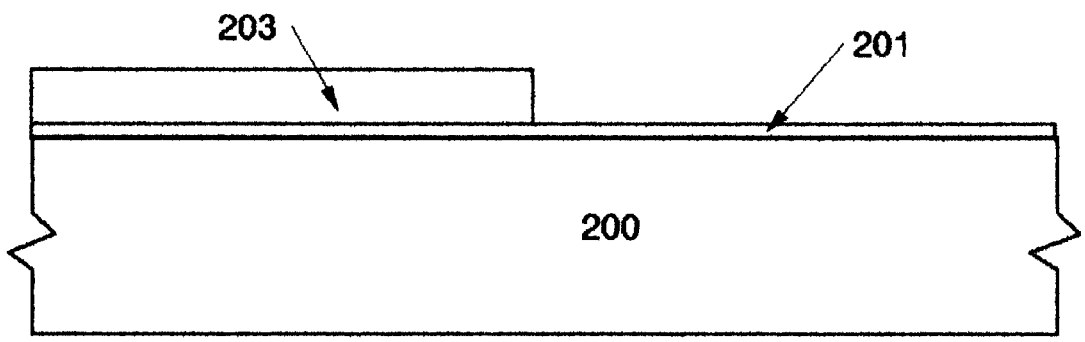

FIGS. 2a–2g depict one embodiment of the method of this invention. As depicted in FIG. 2a, a thin layer 201 of copper or other conducting material is deposited upon substrate 200. A layer 202 of positive photo-resist material is then deposited upon layer 201 and exposed to ultraviolet light in the inverse pattern. The exposed photo-resist material is then removed by chemical developing leaving the portion 203 of the layer of photo-resist material having the design pattern as depicted in FIG. 2b.

Figure 2C:
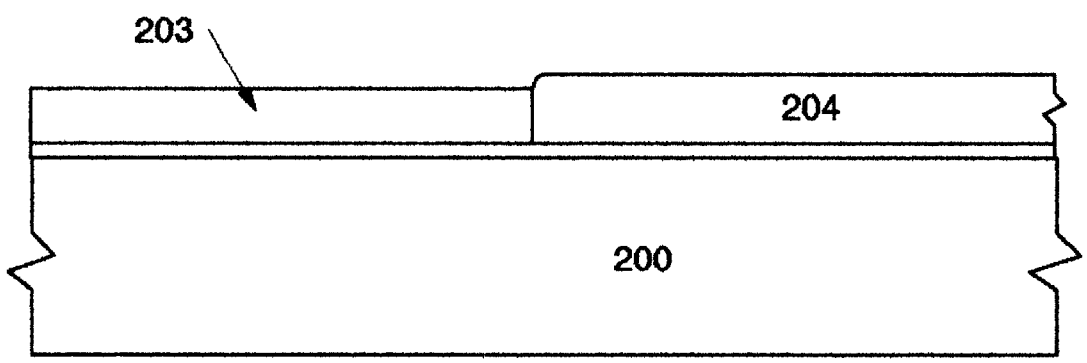
Figure 2D:
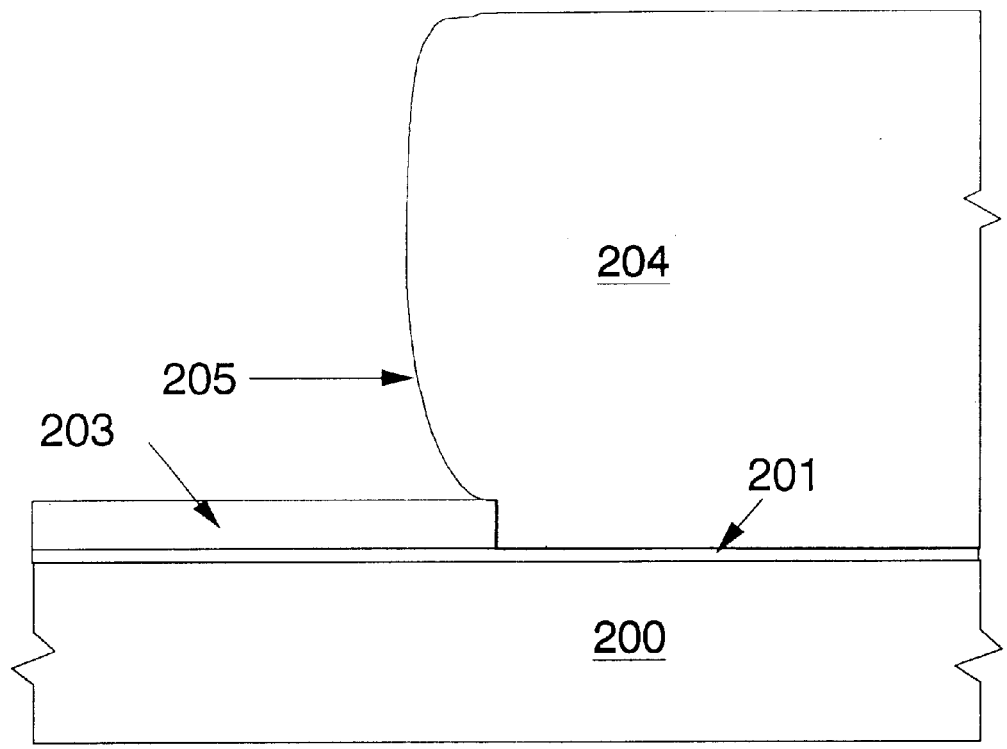

By electroplating or other suitable selective means, additional conducting material 204 is then deposited only upon the exposed portion of conducting layer 201 as depicted in FIG. 2c. The additional conducting material 204 need not necessarily be the same as the conducting material used to form layer 201. As depicted in an exaggerated manner and not to scale in FIG. 2d, the additional conducting material 204 is deposited in a sufficiently thick layer and a manner such that edge 205 of the layer overhangs the boundary of layer 203 of photo-resist material. The electrical current flow in an electroplating bath produces plating primarily perpendicular to the equal-potentials in proximity to conducting layer 201 with some slight sideways plating or mushrooming occurring because of local potential distributions thus giving rise to the overhang 205 depicted in exaggerated form in FIG. 2d.

Figure 2E:
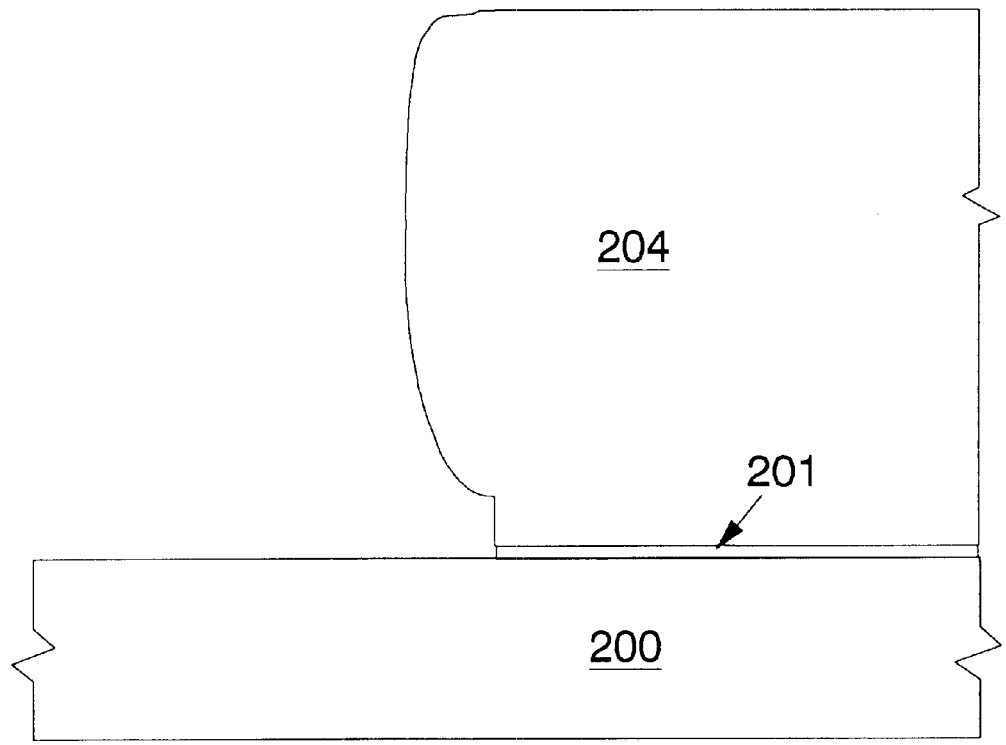

The remaining portions of layer 203 of the photo-resist material and that portion of the thin layer 201 of conducting material underlying the photo-resist material are then removed by chemical etching leaving the thick conducting layer 204 having the inverse pattern depicted in exaggerated form in FIG. 2e.

Figure 2F:
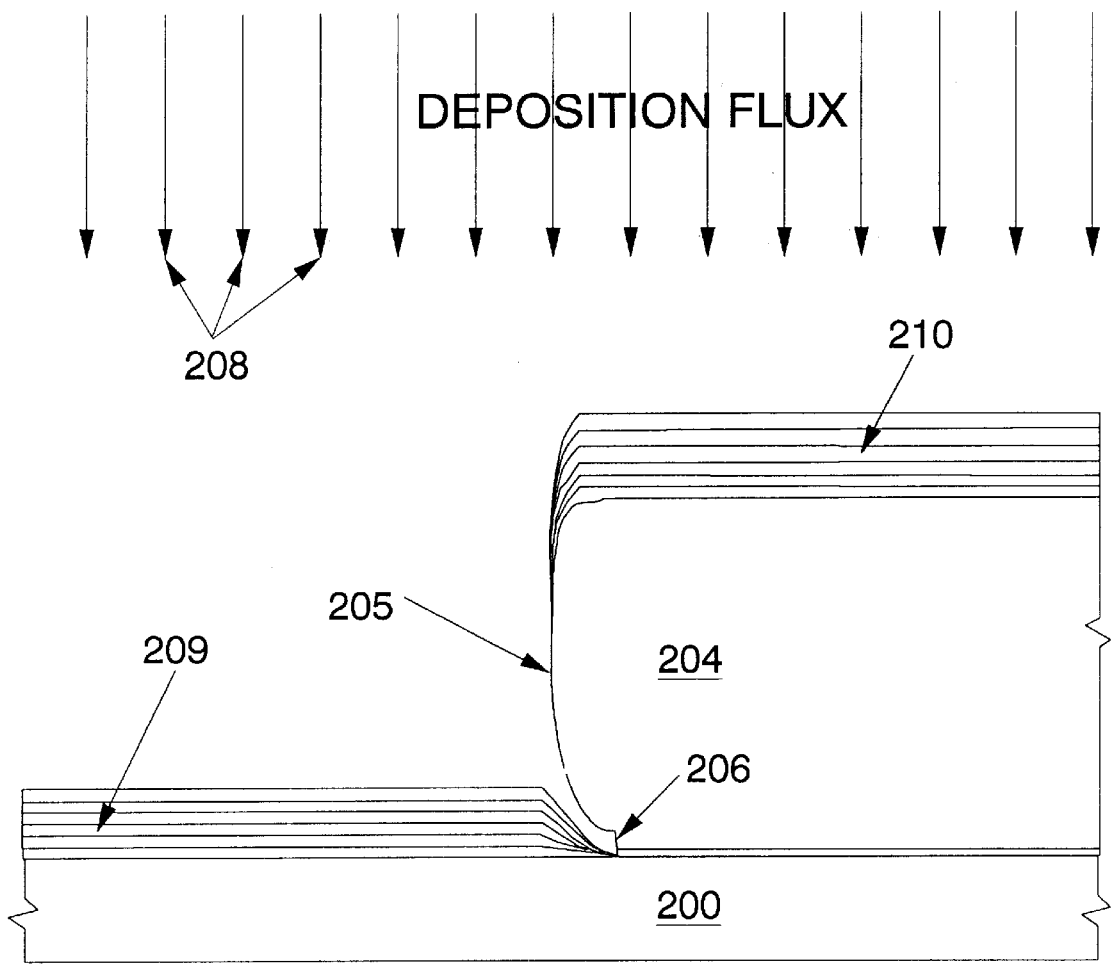
Figure 2G:
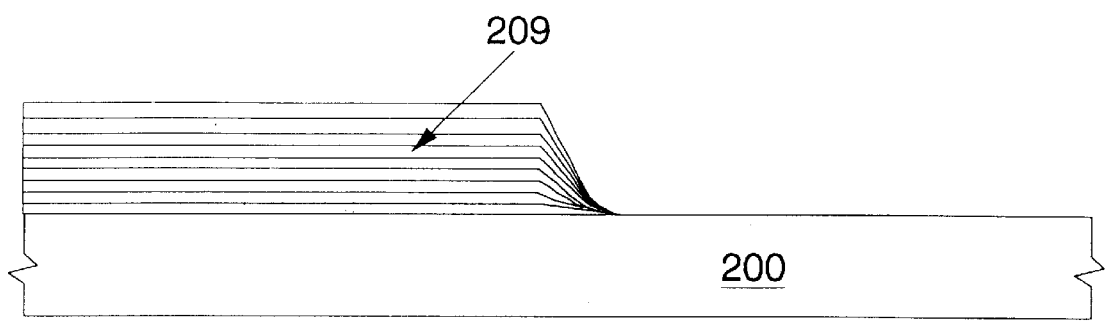

As depicted in exaggerated form in FIG. 2f, one or more layers 209 and 210 of the desired material is then deposited upon the substrate by evaporation or other means that transport the desired material to the substrate, in a directional manner as indicated by the arrows 208 in FIG. 2f, such that the desired material is not deposited upon the portion of edge 206 of layer 204 that is shadowed by overhang 205. Additional layers of desired material nay be successively deposited upon the substrate in this manner. For example, in one application successive layers of material having alternately high and low acoustic impedances may be deposited, each layer having a thickness of one-quarter acoustic wavelength, so as to form an acoustic reflector upon the substrate. The combined thicknesses of the successive layers is restricted only to the extent that the combined height of the layers 209 does not seal off the shadowed edge 206 of layer 204. A chemical etchant is then applied via the shadowed portion of edge 206 to remove layer 204 so that the undesired portions of the desired layers of material are undercut and "lifted-off" from the substrate leaving only the layers 209 of the desired material in the design pattern depicted in FIG. 2g.

Figure 3A:
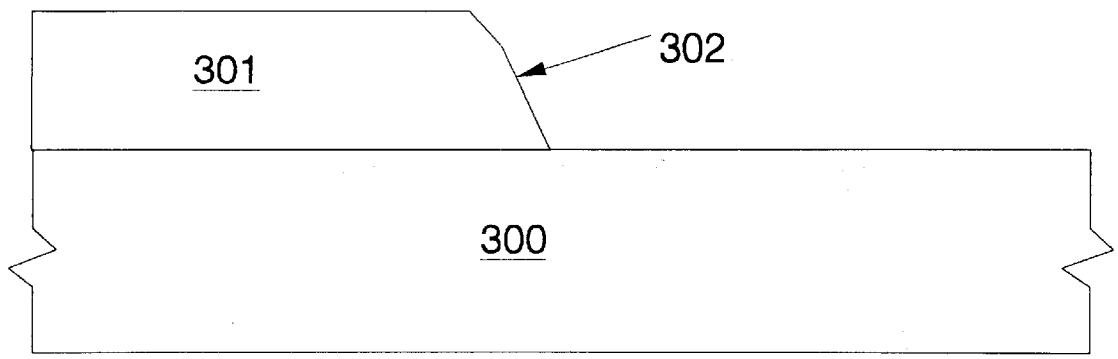
FIGS. 3a–3g depict steps of the method in a second, preferred embodiment of the method of this invention.
Figure 3B:
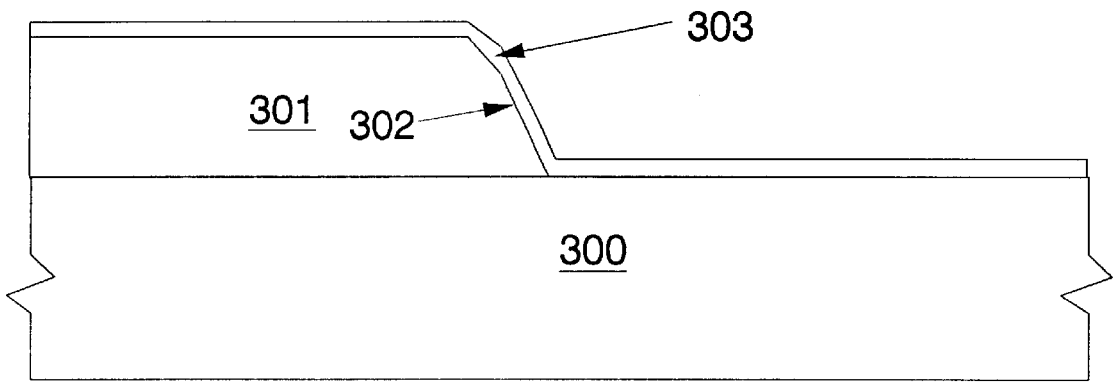

In a second, perffered embodiment of the method of this invention, the lip or edge of conducting material is fabricated using a slightly different procedure. As depicted in FIG. 3a, a layer 301 of photo-resist material is fabricated upon substrate 300 so as to have the design pattern. The design pattern can be obtained by depositing the positive photo-resist material over the entire substrate, exposing the photo-resist material to ultraviolet light in the inverse pattern using a suitable mask and then removing the exposed portions of the photo-resist material by chemical "developing". A hard bake is then used to cause a slight flowing of the photo-resist material so as to obtain a rounded edge 302 to the boundaries of the photo-resist material. As a consequence, the material subsequently deposited upon the substrate will also be deposited upon the surface of this rounded edge. A thin layer 303 of copper or other conducting material is then deposited upon the substrate including upon the surface of the rounded edge 302 of the photo-resist material as depicted in FIG. 3b.

Figure 3C:
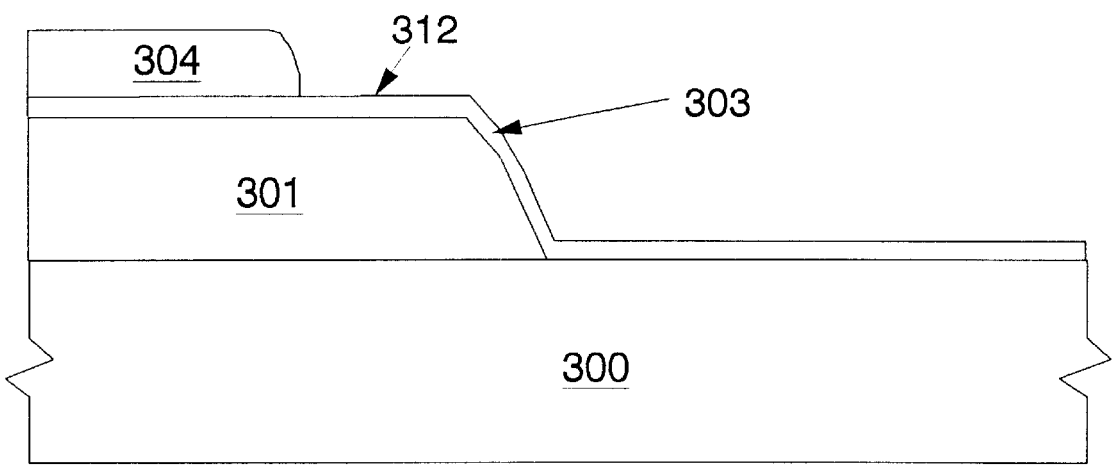

Next, the substrate is covered with a layer of positive photo-resist material and exposed to ultra-violet light using a mask that exposes the layer of photo-resist material to the inverse pattern and that additionally exposes a small portion of the photo-resist material near the boundaries of the design pattern. The portions of the layer of photo-resist material that were exposed to ultra-violet light are then removed by a chemical developing process leaving layer 304 of photo-resist depicted in FIG. 3c, which layer 304 is in the shape of the design pattern except for a small portion 312 near the boundary of the design pattern.

Figure 3D:
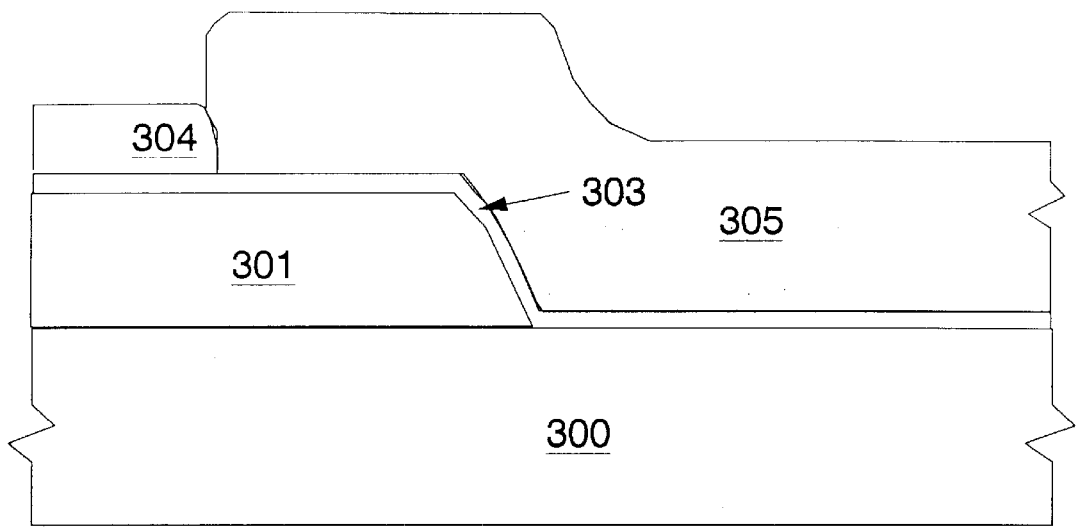

As depicted in FIG. 3d, by electroplating, a relatively thick layer 305 of conducting material is then added to those portions of conducting layer 303 not covered by the layer 304 of photo-resist. The conducting material in layer 305 may be the same as or differ from the conducting material in layer 303.

Figure 3E:
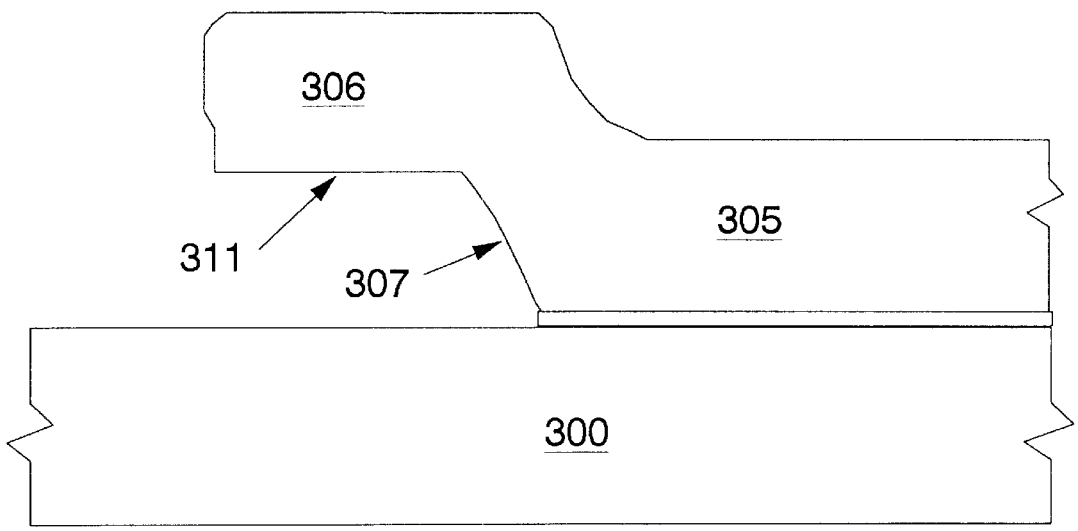

As depicted in FIG. 3e, the remaining layers 301 and 304 of photo-resist and the portion of layer 303 of conducting material intervening between these layers of photo-resist are next removed by chemical etchants. Because layer 303 is much thinner than layer 305 and because of the restricted physical access, the chemical etchants do not remove that portion of layer 303 of conducting material that intervenes between layer 305 of conducting material and substrate 300, although the etching does remove the portion of layer 303 that is not sandwiched directly between layer 305 and substrate 300. As depicted in FIG. 3e, the foregoing process produces layer 305 having a lip 306, with a lower surface 311, which lip 306 overhangs the underlying edge 307 of layer 305.

Figure 3F:
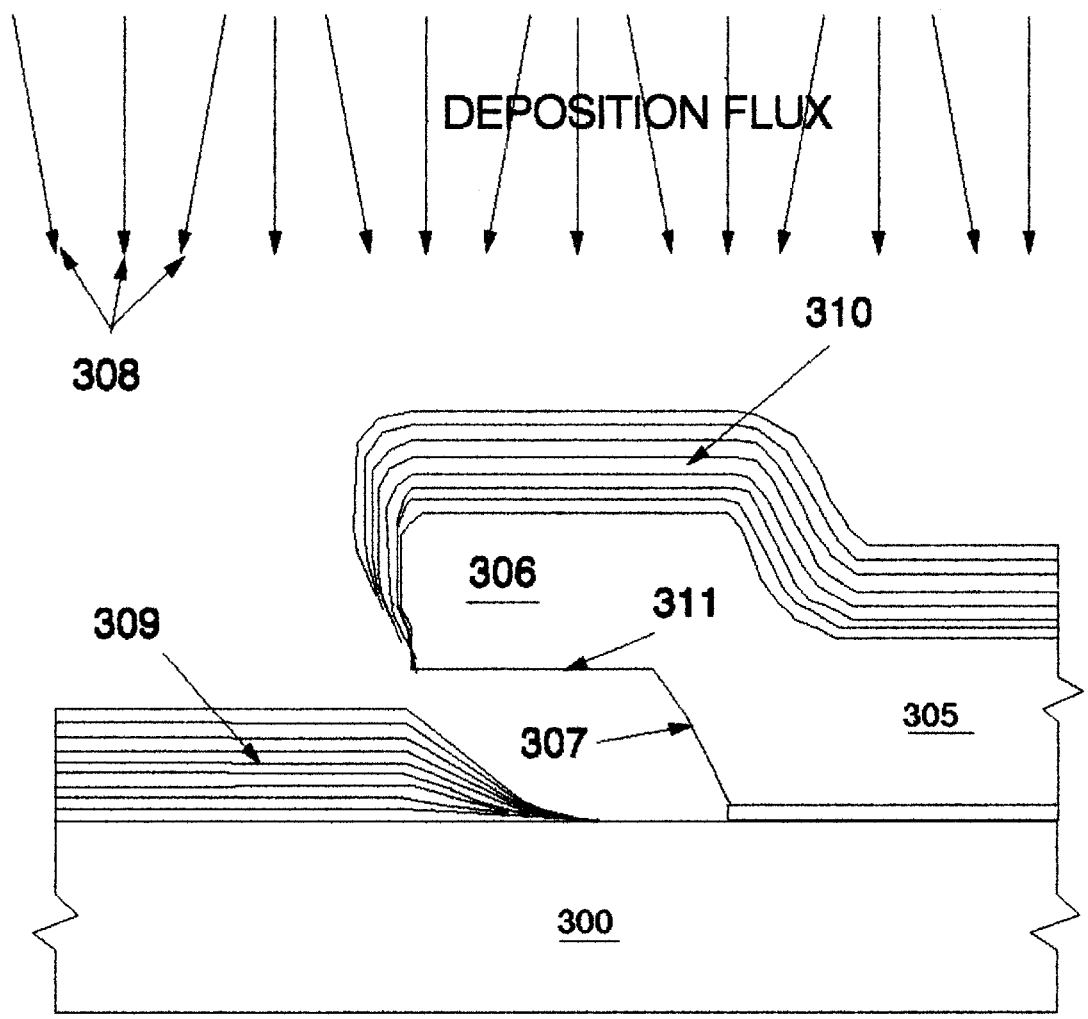

Next the desired material is deposited in one or more layers 309 and 310 upon the substrate using sputtering, plasma enhanced chemical vapor deposition, evaporation or other suitable means that transports the desired material predominantly in the directional manner indicated by arrows 308 in FIG. 3f such that the desired material is not deposited upon edge 307 of layer 305 that is shadowed by lip 306. As in the previous embodiment, successive layers of desired materials may be applied in this manner.

Figure 3G:
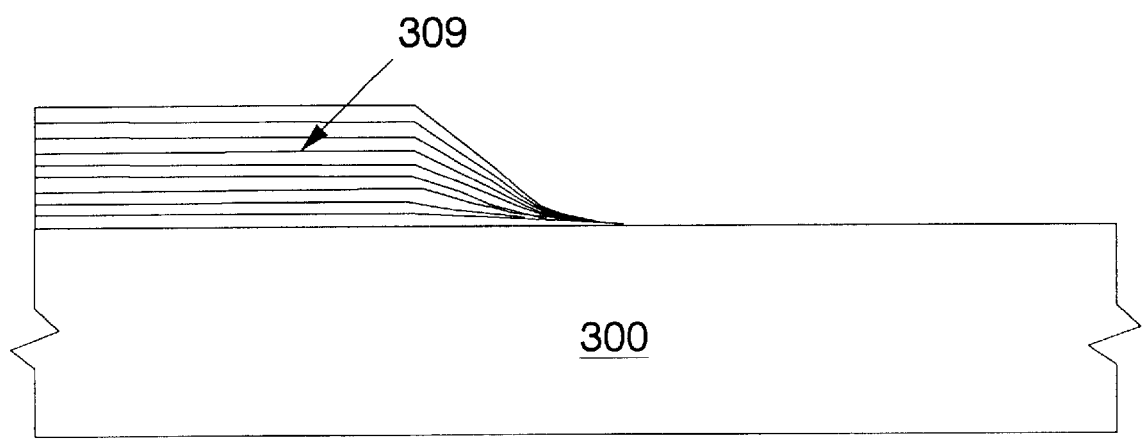

Next, suitable chemical etchants are applied via the shadowed edge 307 of layer 305 to remove layers 303 and 305, thus undercutting and lifting off the overlying portions of the desired material comprising the undesired pattern, thus leaving the layers 309 of the desired material fabricated upon the substrate in the design pattern as depicted in FIG. 3g.

The foregoing method may also be used when the layers 309 and 310 are deposited using methods such as evaporation that exhibit significantly reduced directionality because in such circumstances, the lower surface 311 of layer 305 would still be shadowed from almost all the deposited material, thus leaving a path for the chemical etchants to attack and remove conducting layers 303 and 305 thus lifting off the inverse pattern of desired material leaving the desired material in the design pattern on the substrate.

It should be understood that in the embodiments described above, the actual boundaries of the design pattern and of the inverse pattern used in the fabrication process may have to be altered or adjusted by small amounts so that the effect of the overhanging lip located at the boundary will be such that the layer of desired material fabricated upon the substrate will have the desired, design pattern.

It should also be understood that methods other than patterning using photo-resist materials could instead be used to fabricate the lip 306 depicted in FIG. 3e.

What is claimed is:

1. A method for fabricating upon the upper surface of a substrate a layer of a first material in a desired, design pattern comprising:

fabricating upon the substrate a layer of a second material in an inverse pattern, the second material being an electrically conductive material and the inverse pattern being substantially the inverse of the design pattern, and the layer of second material including a lip at the boundary of the inverse pattern, which lip is displaced from the upper surface of the substrate and extends beyond an underlying edge of the layer of the second material, fabricating upon the substrate and said layer of second material a layer of the first material in a manner such that the lip substantially inhibits the first material from covering substantially all of that portion of the edge of the second material that underlies the lip and the underside of the lip;

removing at least a portion of the layer of second material and the overlying portion of the layer of the first material by chemical etching via that portion of the underlying edge of the second material and underside of the lip that is not substantially covered by the first material.

2. The method of claim 1 in which the fabricating upon the substrate of a layer of a second material in an inverse pattern comprises:

depositing upon the substrate a layer of a first electrically conducting material;

fabricating upon the substrate and the layer of first conducting material a layer of a substantially insulating material having substantially the design pattern;

adding by electroplating a layer of a second electrically conducting material on top of the portion of the layer of first electrically conducting material not covered by the layer of insulating material, the adding of the layer of the second electrically conducting material including the forming of a lip at the boundary of the second electrically conducting material, said lip overhanging the boundary of the insulating material, and wherein the second electrically conducting material may be the same as or differ from the first electrically conducting material;

removing at least a portion of the layer of substantially insulating material from the substrate.

3. The method of claim 2 in which the substantially insulating material is a photo-resist material and the fabricating upon the substrate of the layer of substantially insulating material comprises:

fabricating a layer of photo-resist material upon the layer of first electrically conducting material;

exposing the photo-resist material to a pattern of radiation and developing the photo-resist material so as to leave a layer of the photo-resist material having substantially the design pattern.

4. The method of claim 1 wherein the fabricating upon the substrate of a layer of a second material in an inverse pattern comprises:

fabricating upon the substrate a layer of photo-resist material substantially in the design pattern;

fabricating upon the substrate a layer of a first electrically conducting material having an inverse pattern and including a lip at the boundary of the inverse pattern, which lip overlaps the layer of photo-resist at the boundary of the design pattern;

adding by electroplating a layer of a second electrically conducting material on top of the layer of first electrically conducting material, wherein the second electrically conducting material may be the same as or differ from the first electrically conducting material;

removing at least a portion of the layer of photo-resist material.

5. A method for fabricating upon the upper surface of a substrate a layer of a first material in a desired, design pattern comprising:

depositing upon the substrate a layer of a first electrically conducting material;

fabricating upon the substrate and the layer of first electrically conducting material a layer of a substantially insulating material having substantially the design pattern;

adding by electroplating a layer of a second electrically conducting material on top of the portion of the layer of first electrically conducting material not covered by the layer of insulating material, the adding of the layer of the second electrically conducting material including the forming of a lip at the boundary of the second electrically conducting material, said lip overhanging the boundary of the insulating material, and wherein the second electrically conducting material may be the same as or differ from the first electrically conducting material;

removing at least a portion of the layer of substantially insulating material from the substrate;

fabricating upon the substrate and said layer of second electrically conducting material a layer of the first material in a manner such that the lip substantially inhibits the first material from covering substantially all of that portion of an edge of the second electrically conducting material that underlies the lip and the underside of the lip;

removing at least a portion of the layer of second electrically conducting material and the overlying portion of the layer of the first material by chemical etching via that portion of the underlying edge of the second electrically conducting material and underside of the lip that is not substantially covered by the first material.

6. A method for fabricating upon the upper surface of a substrate a layer of a first material in a desired, design pattern comprising:

fabricating upon the substrate a layer of photo-resist material substantially in the design pattern;

fabricating upon the substrate a layer of a first electrically conducting material having an inverse pattern and including a lip at the boundary of the inverse pattern, which lip overlaps the layer of photo-resist at the boundary of the design pattern;

adding by electroplating a layer of a second electrically conducting material on top of the layer of first electrically conducting material, wherein the second electrically conducting material may be the same as or differ from the first electrically conducting material;

removing at least a portion of the layer of photo-resist material;

fabricating upon the substrate and said layer of second electrically conducting material a layer of the first material in a manner such that the lip substantially inhibits the first material from covering substantially all of that portion of an edge of the second electrically conducting material that underlies the lip and the underside of the lip;

removing at least a portion of the layer of second electrically conducting material and the overlying portion of the layer of the first material by chemical etching via that portion of the underlying edge of the second electrically conducting material and underside of the lip that is not substantially covered by the first material.

* * * * *